(12) United States Patent
Khoshakhlagh et al.

(10) Patent No.: US 9,831,372 B2
(45) Date of Patent: Nov. 28, 2017

(54) P-COMPENSATED AND P-DOPED SUPERLATTICE INFRARED DETECTORS

(71) Applicant: California Institute of Technology, Pasadena, CA (US)

(72) Inventors: Arezou Khoshakhlagh, Pasadena, CA (US); David Z. Ting, Arcadia, CA (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 15/154,704

(22) Filed: May 13, 2016

(65) Prior Publication Data

US 2016/0336476 A1    Nov. 17, 2016

Related U.S. Application Data

(60) Provisional application No. 62/160,766, filed on May 13, 2015.

(51) Int. Cl.
| | |
|---|---|
| *H01L 27/148* | (2006.01) |
| *H01L 31/09* | (2006.01) |
| *H01L 31/0304* | (2006.01) |
| *H01L 31/0352* | (2006.01) |

(52) U.S. Cl.
CPC ......... *H01L 31/09* (2013.01); *H01L 31/03042* (2013.01); *H01L 31/03046* (2013.01); *H01L 31/035236* (2013.01)

(58) Field of Classification Search
CPC ............. H01L 27/307; H01L 31/02164; H01L 31/1013; H01L 31/1175; H01L 27/14; H01L 27/30; H01L 31/00; H01L 31/09; H01L 31/101; H01L 51/42; H01L 27/14649; H01L 27/14652; H01L 27/14669; H01L 27/14875

See application file for complete search history.

(56) References Cited

U.S. PATENT DOCUMENTS

| | | | |
|---|---|---|---|
| 4,843,439 A * | 6/1989 | Cheng ................. | B82Y 20/00 257/19 |
| 8,217,480 B2 | 7/2012 | Ting et al. | |
| 2014/0332755 A1* | 11/2014 | Wei ................ | H01L 31/035236 257/21 |

OTHER PUBLICATIONS

Y. Lin, D. Wang, D. Donetsky, G. Belenky, H. Hier, W.L. Sarney, and S.P. Svensson, "Minority Carrier Lifetime in Beryllium-Doped InAs/InAsSb Strained Layer Superlattices", Jun. 3, 2014, Journal of Electronic Material, vol. 43, No. 9, pp. 3184-3190.*

(Continued)

*Primary Examiner* — Cuong B Nguyen

(57) ABSTRACT

Barrier infrared detectors configured to operate in the long-wave (LW) infrared regime are provided. The barrier infrared detector systems may be configured as pin, pbp, barrier and double heterostructrure infrared detectors incorporating optimized p-doped absorbers capable of taking advantage of high mobility (electron) minority carriers. The absorber may be a p-doped Ga-free InAs/InAsSb material. The p-doping may be accomplished by optimizing the Be doping levels used in the absorber material. The barrier infrared detectors may incorporate individual superlattice layers having narrower periodicity and optimization of Sb composition to achieve cutoff wavelengths of ~10 μm.

14 Claims, 10 Drawing Sheets

Double heterostructure

(56) References Cited

OTHER PUBLICATIONS

Hoglund, L. et al., Applied Physics Letters, vol. 103, Nov. 26, 2013, 221908.
Khoshakhlagh et al., IEEE Journal of Quantum Electronics, vol. 46, No. 6, Jun. 6, 2010, pp. 959-964.
Klipstein, P. et al., J. Proc. SPIE, vol. 7608, 2010, pp. 76081V-76081V-10.
Maimon, S. et al., Appl. Phys. Lett., vol. 89, No. 15, Oct. 10, 2006, 151109.
Steenbergen, E. H. et al., Applied Physics Letters, vol. 99, Dec. 22, 2011, 251110.
Ting et al., Appl. Phys. Lett., vol. 95, Jul. 16, 2009, 023508.

\* cited by examiner

P-COMPENSATED AND P-DOPED SUPERLATTICE INFRARED DETECTORS

STATEMENT OF RELATED APPLICATIONS

The present application claims priority to U.S. Provisional Patent Application No. 62/160,766, filed May 13, 2015, the disclosure of both of which is incorporated herein by reference.

STATEMENT OF FEDERAL FUNDING

The invention described herein was made in the performance of work under a NASA contract NNN12AA01C, and is subject to the provisions of Public Law 96-517 (35 USC 202) in which the Contractor has elected to retain title.

FIELD OF THE INVENTION

The present invention generally relates to infrared detectors, and more particularly to systems and methods of forming long wavelength infrared detectors.

BACKGROUND OF THE INVENTION

High performance and low cost are often the main driving forces for determining whether a particular technology will enjoy widespread adoption. Over the past few years, superlattice (SL) technology operating in the mid- and long-wavelength infrared has progressed significantly, demonstrating the potential for realization of high performance infrared sensor materials. In particular, the type II SL material system has been identified as particularly promising for infrared detection as its cut-off wavelength can span a broad spectrum from mid-wavelength infrared (MWIR) to very long-wavelength infrared (VLWIR) (3 µm<$\lambda$<30 µm) by engineering the layer thicknesses. The major advantage of the SL material for IR detection applications is that it is a mechanically robust III-V material platform, which offers all the advantages of the III-V material system and is capable of normal incidence absorption, and therefore has high quantum efficiency.

More recently, barrier infrared detector (BIRD) designs such as the nBn device design (Maimon and Wicks, Appl. Phys. Lett., vol. 89, no. 15, p. 151109, 2006, the disclosure of which is incorporated herein by reference) have enhanced the performance of superlattices in the MWIR region by reducing the Shockley-Read-Hall (SRH) associated dark currents. Elaboration of these nBn design have shown the superiority of these barrier devices for MWIR (U.S. Pat. No. 8,217,480 B2, the disclosure of which is incorporated herein by reference), and LWIR (Ting et al., Appl. Phys. Lett. 95, 023508 (2009), the disclosure of which is incorporated herein by reference).

Despite the promise offered by SL technology and BIRD device designs barrier infrared detectors configured to operate in the long-wave infrared regime are challenging to form.

SUMMARY OF THE INVENTION

In accordance with embodiments, systems and methods of implementing infrared detectors capable of operating in the long-wave infrared regime are provided.

Many embodiments are directed to an infrared photodetector absorber material formed of a p-doped Ga-free superlattice material having a cutoff wavelength of from 8 to 13 µm, wherein the superlattice material is sufficiently doped to compensate for residual n-type carriers.

In other embodiments the superlattice material is formed of alternating layers of InAsSb and InAs. In some such embodiments the superlattice material is doped with Be. In other such embodiments the Be is incorporated into the superlattice material in a concentration of from $1 \times 10^{15}$ to $5 \times 10^{15}$ cm$^{-3}$. In still other such embodiments the Be is incorporated into the superlattice material in a concentration of about $2.5 \times 10^{15}$ cm$^{-3}$. In yet other such embodiments Sb is in a concentration of around 59%.

Many other embodiments are directed to an infrared photodetector, including:
 a substrate formed of a substrate material; and
 an infrared detector structure disposed atop the substrate and at least comprising at least one Ga-free absorber superlattice having a cutoff wavelength of from 8 to 13 µm, wherein the superlattice material is sufficiently doped to compensate for residual n-type carriers.

In still other embodiments the superlattice material is formed of alternating layers of InAsSb and InAs. In some such embodiments Sb is in a concentration of around 59%.

In yet other embodiments the superlattice material is doped with Be. In some such embodiments the Be is incorporated into the superlattice material in a concentration of from $1 \times 10^{15}$ to $5 \times 10^{15}$ cm$^{-3}$. In other such embodiments the Be is incorporated into the superlattice material in a concentration of about $2.5 \times 10^{15}$ cm$^{-3}$.

In still yet other embodiments the detector further includes one or more structures selected from the group consisting of contact layers, unipolar barrier layers, and graded transitional structures. In some such embodiments the detector includes at least one graded transitional structure disposed between at least two other layers of the photodetector to align at least one portion of the bandgap of the photodetector.

In still yet other embodiments the substrate is a material selected from the group consisting of Si, GaAs, Ge, InAs, GaP, and InP.

In still yet other embodiments the detector has a structure selected from the group of pin, pBp, nBn, homojunction, heterostructure, and double heterostructure.

Various other embodiments are directed to infrared photodetectors including:
 a substrate formed of a substrate material; and
 an infrared detector structure disposed atop the substrate and at least comprising at least one Ga-free absorber superlattice formed of alternating layers of InAsSb and InAs having a cutoff wavelength of from 8 to 13 µm, wherein the superlattice material is sufficiently p-type doped with Be to compensate for residual n-type carriers.

In many such embodiments the Be is incorporated into the superlattice material in a concentration of from $1 \times 10^{15}$ to $5 \times 10^{15}$ cm$^{-3}$. In other such embodiments the Be is incorporated into the superlattice material in a concentration of about $2.5 \times 10^{15}$ cm$^{-3}$. In still other such embodiments Sb is in a concentration of around 59%.

In still yet other embodiments the photodetectors further include one or more structures selected from the group consisting of contact layers, unipolar barrier layers, and graded transitional structures.

Additional embodiments and features are set forth in part in the description that follows, and will become apparent to those skilled in the art upon examination of the specification or may be learned by the practice of the disclosed subject matter. A further understanding of the nature and advantages of the present disclosure may be realized by reference to the remaining portions of the specification and data, which forms a part of this disclosure.

BRIEF DESCRIPTION OF THE DRAWINGS

These and other features and advantages of the present invention will be better understood by reference to the following detailed description when considered in conjunction with the accompanying figures and data, wherein.

Figure 1A:
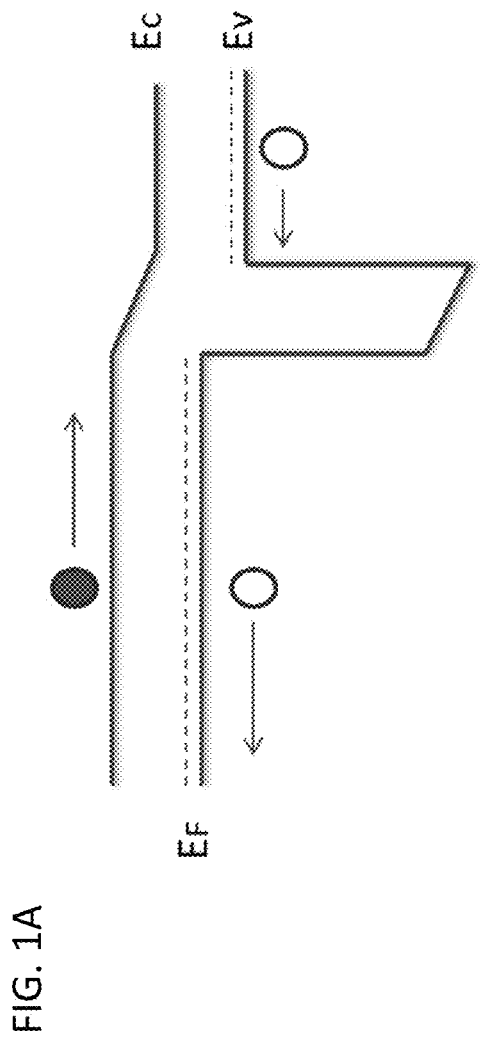
FIG. 1A schematically illustrates the band structure of a pin infrared detector in accordance with embodiments.

Additional embodiments and features are set forth in part in the description that follows, and will become apparent to those skilled in the art upon examination of the specification or may be learned by the practice of the disclosed subject matter. A further understanding of the nature and advantages of the present disclosure may be realized by reference to the remaining portions of the specification and data, which forms a part of this disclosure.

DETAILED DESCRIPTION OF THE INVENTION

Turning to the drawings, systems and methods of implementing infrared detectors configured to operate in the long-wave (LW) infrared regime are provided. In many embodiments, the infrared detector systems are configured as pin infrared detectors, but can be implemented in pBp, nBn, homojunction, heterostructures, and double heterostructure infrared detectors incorporating optimized p-doped absorbers capable of taking advantage of high mobility (electron) minority carriers. In many embodiments the absorber is a p-doped Ga-free InAs/InAsSb material. In many embodiments, the p-doping is accomplished by optimizing the Be doping levels used in the absorber material. In other embodiments the infrared detectors incorporate individual superlattice layers having narrower periodicity and optimization of Sb composition to achieve the target cutoff wavelength (~13 µm).

Large Band Gap Infrared Detectors

Type-II strained layer superlattice based infrared detectors offer an alternative to existing Mercury Cadmium Telluride operating in the long-wave (LW) infrared regime. Type-II superlattices (SLs) are based on mature III-V technology in which the bandgap can be tailored over midwave, long-wave, and very long-wave regions of infrared spectrum by varying the thickness of constituent materials. Other potential advantages of type-II SLs are their high quantum efficiencies due to normal incidence absorption, reduction of tunneling and auger dark currents due to large electron effective mass and large splitting between heavy-hole and light-hole valence subbands, respectively. Most of the present day SL-based infrared detectors are based on InAs/Ga (In)Sb superlattices.

Large band gap barrier infrared detectors (BIRD) have gained interest in recent years due to the possibility of lowering the Shockley Reed Hall (SRH) associated dark current by eliminating depletion region and possibility of obtaining diffusion current limited behavior for all temperature ranges. Despite all the advantages that InAs/Ga(In)Sb SL based detectors offer, Ga containing SL performance are limited by dark current associated with surface states and the Shockley-Read-Hall (SRH) centers. (See, e.g., A. Khoshakhlagh, et al., IEEE Journal of Quantum Electronics, 46, No. 6, 2010, the disclosure of which is incorporated herein by reference.) Hence, type-II InAs/GaSb SLs show short lifetime values (50 ns for midwave and 35 ns for longwave). It is suspected that Ga lowers the carrier lifetime by generating acceptor-like defects in GaSb. Ga-free InAs/ InAsSb SLs represent another alternative for infrared detector applications due to possible lower SRH recombination centers as well as lower defect density material which is as result of simpler growth mechanism and fewer shuttering sequences during the growth of these SLs. (See, e.g., U.S. Pat. No. 8,217,480, the disclosure of which is incorporated herein by reference.)

Two fundamental figures of merit for infrared detectors and focal plane arrays (FPAs), namely dark current (noise) and quantum efficiency (signal), are directly influenced by the absorber layer minority carrier type, lifetime and its diffusion length. Unintentionally doped mid-wave InAs/ InAsSb SLs (residually n-doped) have shown high lifetime values (2-10 µs) for holes, the minority carriers, that has resulted in high performance midwave detectors (~5 µm). (See, e.g., L. Hoglund, et al., Applied Physics Letters, 103, 221908, 2013; and E. H. Sttenbergen, et al., Applied Physics Letters, 99, 251110, 2011, the disclosures of which are incorporated herein by reference.) One method that has been attempted to shift the center wavelength of such superlattice structures to longer wavelengths is to increase the superlattice period for a given Sb composition in InAsSb layer. The increase in superlattice period increases the minority carrier (hole) effective mass and therefore decreases its mobility; hence, the minority carrier diffusion length decreases. However, as the minority carrier diffusion length decreases, fewer carriers diffuse out of the absorber layer and reach the contacts, which decreases the quantum efficiency of the device. Additionally, when individual period thickness increases oscillator strength and consequently quantum efficiency decreases. Accordingly, thus far type-II strained layer superlattice based infrared detectors have not been developed that capable of operating effectively in the long-wave regime.

P-Doped and P-Compensated Infrared Detector Systems

Figure 1B:
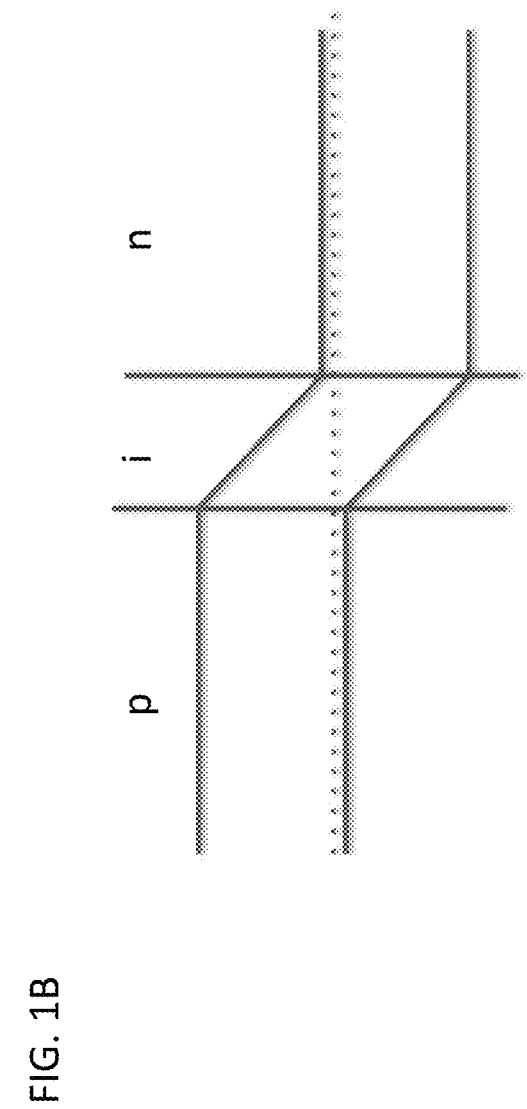
FIG. 1B schematically illustrates the band structure of a pBp barrier infrared detector in accordance with embodiments.
Figure 1C:
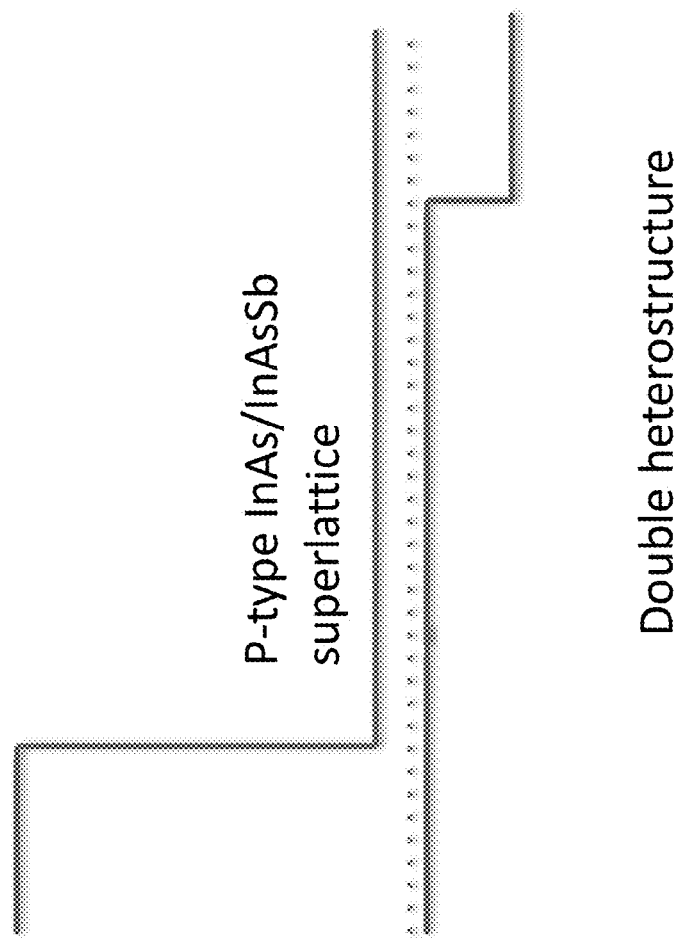
FIG. 1C schematically illustrates the band structure of a double heterostructure infrared detector in accordance with embodiments.

In embodiments, type-II strained layer superlattice based barrier, pin, homojunction, and heterostructure infrared detectors are provided that are configured to operate in the long-wave regime (i.e., at cutoff wavelengths of from ~8 to 13 µm). In particular, in many embodiments to overcome the low mobility (hole) minority carriers and increase the quantum efficiency of the long wavelength InAs/InAsSb SLs, p-type absorbers are provided to take advantage of high mobility (electron) minority carriers. Exemplary band structures and operation of such pin (FIG. 1A), pBp (FIG. 1B), and double heterostructure (FIG. 1C) detectors are illustrated.

Infrared detectors in accordance with the disclosure recognize that the absorber doping compensation and its concentration is an important parameter in achieving low dark current and high quantum efficiency long-wave (LW) InAs/InAsSb type-II SL detectors. Accordingly, many embodiments incorporate optimized levels of beryllium (Be)-p doped InAs layers in the detector structures to provide an effective mechanism to decreased dark current by lowering the diffusion, generation-recombination (GR) and tunneling currents as well as increasing the quantum efficiency of the device by switching to high mobility minority electron concentrations.

Figure 2:
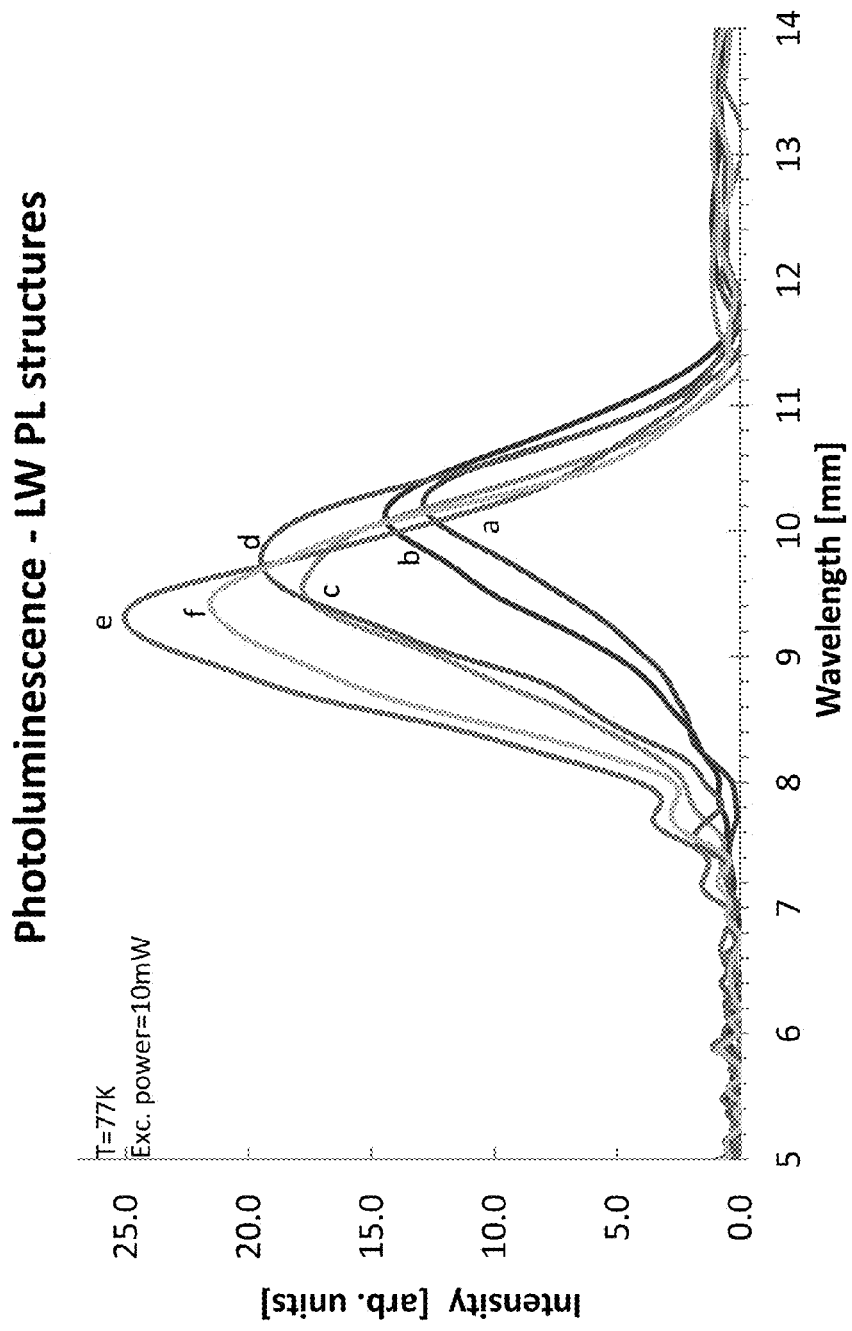
FIG. 2 provides a data graph of the PL intensity versus wavelength for exemplary p-doped materials in accordance with embodiments and an unintentionally doped material, where: (a) is unintentionally doped, (b) is Be-doped $1 \times 10^{15}$ $cm^{-3}$, (c) is Be-doped $5 \times 10^{15}$ $cm^{-3}$, (d) is Be-doped $1 \times 10^{16}$ $cm^{-3}$, (e) is Be-doped $2.5 \times 10^{16}$ $cm^{-3}$, and (f) is Be-doped $5 \times 10^{14}$ $cm^{-3}$.

FIG. 2 provides data graphs from exemplary embodiments developed to demonstrate and study p-doped long-wave InAs/InAsSb SLs in accordance with embodiments. As shown, a set of sample absorber materials with different Be doping levels were studied and compared with un-intentionally doped (residually n-type) longwave InAs/InAsSb SL. Embodiments of these absorbers were configured to have long cut off wavelengths of around (~10 µm), such as by shorting the period of the superlattice and providing higher Sb content of (~59%), as may be known. The data clearly shows that Be doped SL absorbers (plots b to f) all demonstrate high cut-off wavelengths of from 9.3 to 10.2 2 µm at 77 K that are comparable to the unintentionally doped absorber (plot a). Accordingly, p-doped InAs/InAsSb SL absorbers in accordance with embodiments are operational at long wavelengths, and simultaneously show high intensities as well.

A conventional nBn device design developed by Maimon and Wicks, consists of an n-type absorber layer, a wide band gap barrier region followed by an n-type contact. (See, e.g., S. Maimon, and G. W. Wicks, Applied Physics Letter 89, 1511009, 2006, the disclosure of which is incorporated herein by reference.) Klipstein has also worked with a similar design which was termed XBn in which X could be an n-type or p-type material. (See, e.g., P. Klipstein, et al., J. Proc. SPIE, 7608, 76081 V-76081V-10, 2010, the disclosure of which is incorporated herein by reference.) Non-intentionally doped InAs/InAsSb SLs are intrinsically n-doped.

In general, high concentrations of both donor and acceptor doping species introduce scattering centers by introducing energy levels in the band gap in the vicinity of the valence band for acceptor species or in the vicinity of the conduction band for donor species. These energy levels are known to enhance the trapping of the free carriers and therefore reduce the minority carrier lifetime. Lifetime is directly proportional to carrier concentration by:

$$\tau_{n0} = \frac{1}{\alpha_r p_0}$$

(for p-type samples) and $$\tau_{p0} = \frac{1}{\alpha_r n_0}$$

(for n-type sample). Where $\tau_{n0}$, $\tau_{p0}$, $\alpha_r$, $p_0$, and $n_0$ are minority carrier lifetime electron, minority carrier lifetime hole, constant, hole and electron carrier concentrations, respectively.

The above expressions clearly express that low levels of total carrier concentration generally results in higher lifetime values. Accordingly, in many embodiments the Be doping of long-wave InAs/InAsSb SL is engineered to improve both lifetime and quantum efficiency by reducing the carrier concentration in order to enhance the lifetime as well as switching the low mobility minority carrier of holes in undoped InAs/InAsSb to high mobility electrons in compensated p-doped SL.

Figure 3:
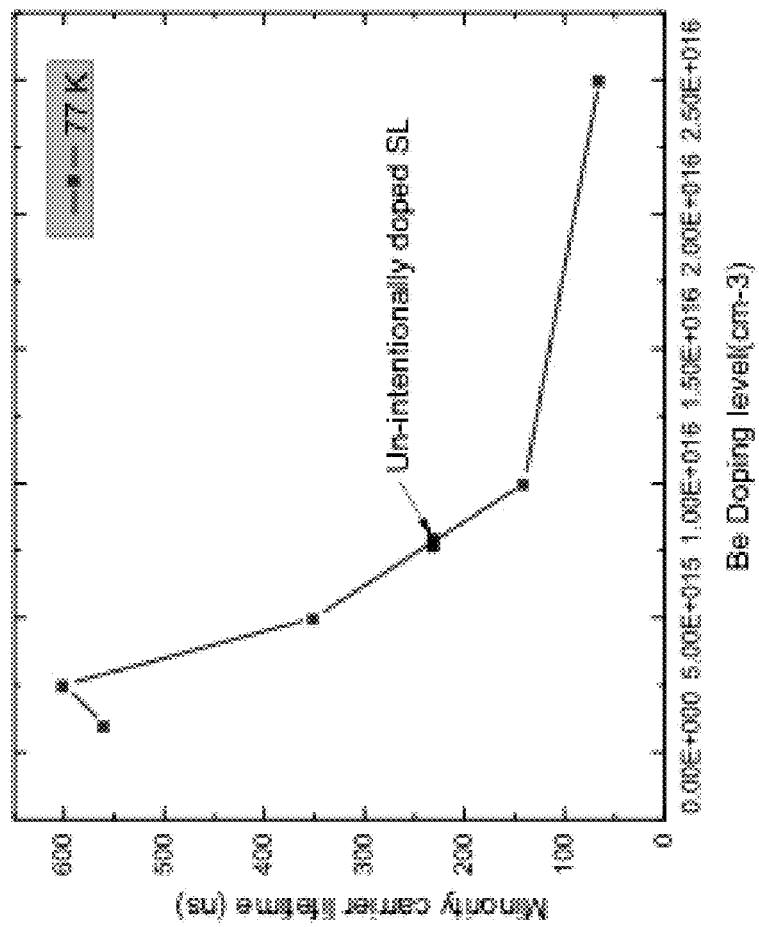
FIG. 3 provides a data graph plotting minority carrier lifetime versus Be doping level for exemplary p-doped materials in accordance with embodiments.

FIG. 3 provides data from embodiments demonstrating the minority carrier lifetime of the five samples as a function of doping level, which clearly shows a strong dependence on carrier concentration. Specifically, as data clearly shows the highest lifetime value is obtained from the sample with doping level of Be of around $2.5 \times 10^{15}$ cm$^{-3}$. (Note that the lifetime valued obtained from un-intentionally doped SL is inserted in the graph for comparison.) Accordingly, many embodiments provide a concentration of P-doping of Be of from $1)(10^{15}$ cm$^{-3}$ to $5 \times 10^{15}$ cm$^{-3}$, and in many embodiment around $2.5 \times 10^{15}$ cm$^{-3}$, which results in the lowest level of the SL carrier concentration and therefore the closest doping level which compensates all the residual n-type carriers.

Accordingly, many embodiments are directed to long-wave superlattice infrared detector absorbers and devices made therefrom. Embodiments of such absorber materials are formed in many embodiments from a p-doped Ga-free superlattice material (e.g., InASSb/InAs). In various embodiments the absorber materials are p-doped with Be in a concentration to compensate for residual n-type carriers (e.g., from $1 \times 10^{15}$ to $5 \times 10^{15}$ cm$^{-3}$, and in many embodiments around $2.5 \times 10^{15}$ cm$^{-3}$). In various embodiments the periodicity and composition of the InAsSb/InAs absorber is configured such that the absorber has a cut-off wavelength in the long-wave regime.

In various embodiments the p-doped Ga-free absorber is incorporated into a suitable infrared detector device, such as a pBp, barrier, and/or heterostructure devices, or a pn diode, etc. In many such embodiments the device may incorporate any number of compatible layers, including contact layers, graded transition layers, support layers, etc. The support layer may incorporate a substrate material selected from the group consisting of Si, GaAs, Ge, InAs, GaP, and InP. Exemplary devices that may be made using the p-doped absorber materials in accordance with the invention may be found, for example, in Maimon & Wicks or Klipstein and/or U.S. Pat. No. 8,217,480 B2 (all cited above).

Specific examples and embodiments of infrared detectors formed in accordance with these methods are described in greater detail below.

EXEMPLARY EMBODIMENTS

The above general forming methodologies will be better understood with reference to the following examples, which are presented for the purposes of elucidation only, and are not to be taken as limiting the scope of the disclosure.

Example 1: pn Diode

In an exemplary embodiment, a LWIR superlattice infrared absorber forming a pn Diode was grown in accordance with Table 1, below. The LW cutoff pn detector utilizes a strain-balanced SL absorber that is a digital alloy of layers of InASSb/InAS and InAs/InAsSb superlattice materials forming the various layers including, top contact, transition grading, transition layer, absorber, transition layer, grounded graded and ground plane formed atop an underlayer of GaSb. Specifically, the absorber material was configured to have a cutoff wavelength of about 9 μm.

TABLE 1

LW pn Diode Bird Structure

| | Top Contact | Transition Graded | Transition Layer | Absorber | Transition Layer | Grounded Graded | Ground plane | Underlayer |
|---|---|---|---|---|---|---|---|---|
| Material | InAsSb/InAs SL | InAs/ InAsSb | InAs/ InAsSb | InAsSb/ InAs SL | InAsSb/ InAs SL | InAsSb/ InAs SL | InAsSb/ InAs SL | GaSb |
| Depth | 123 nm | 61 nm | 184 nm | 4.8 μm | 184 nm | 61 nm | 456 nm | 0.55 μm |
| Doping (cm$^{-3}$) | p~3 × 10$^{18}$ | p~7 × 10$^{17}$ | p~1 × 10$^{17}$ | p~4 × 10$^{15}$ | n~1 × 10$^{17}$ | n~7 × 10$^{17}$ | n~3 × 10$^{18}$ | |

Figure 4A:
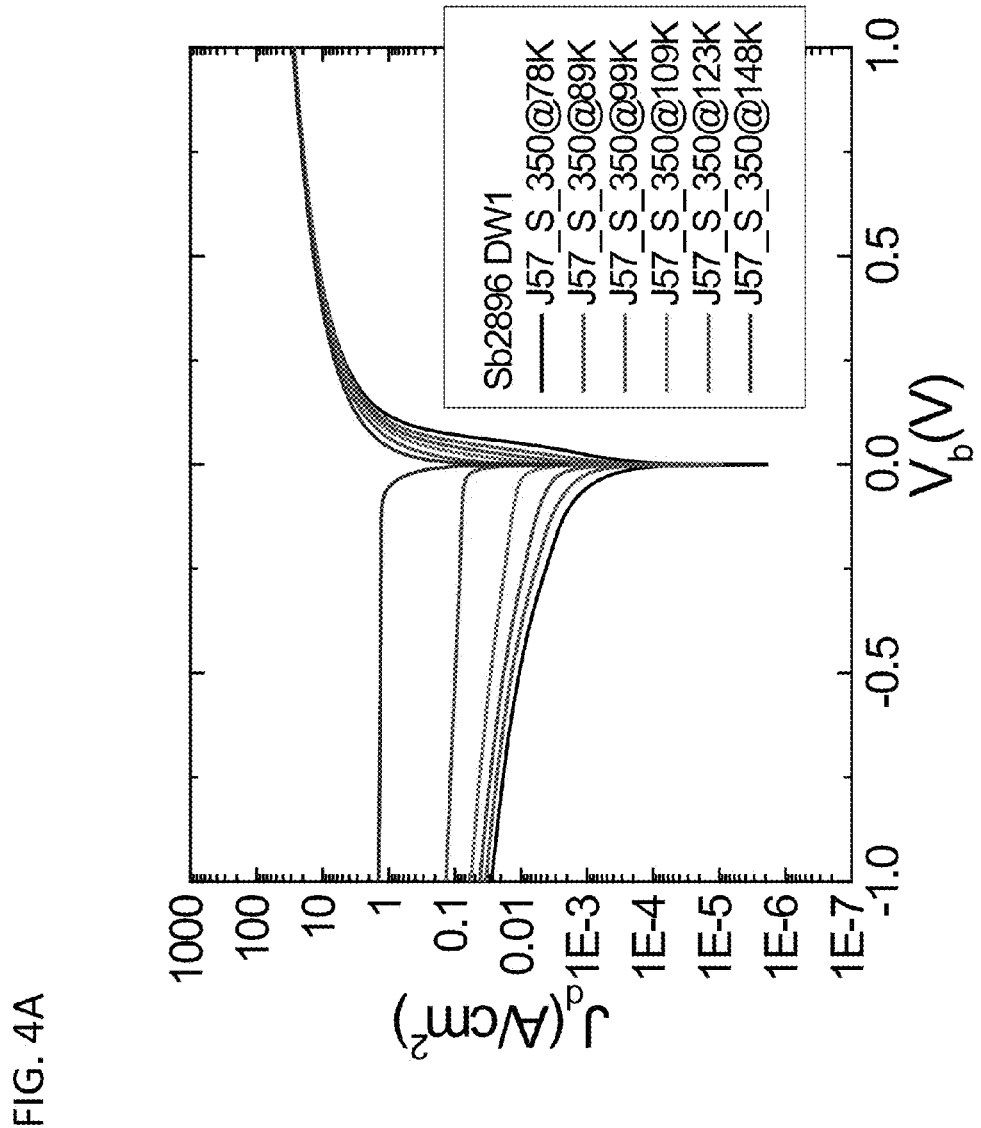
FIG. 4A provides a data graph plotting the dark current density versus voltage bias for a long wave barrier detector formed in accordance with embodiments.
Figure 4B:
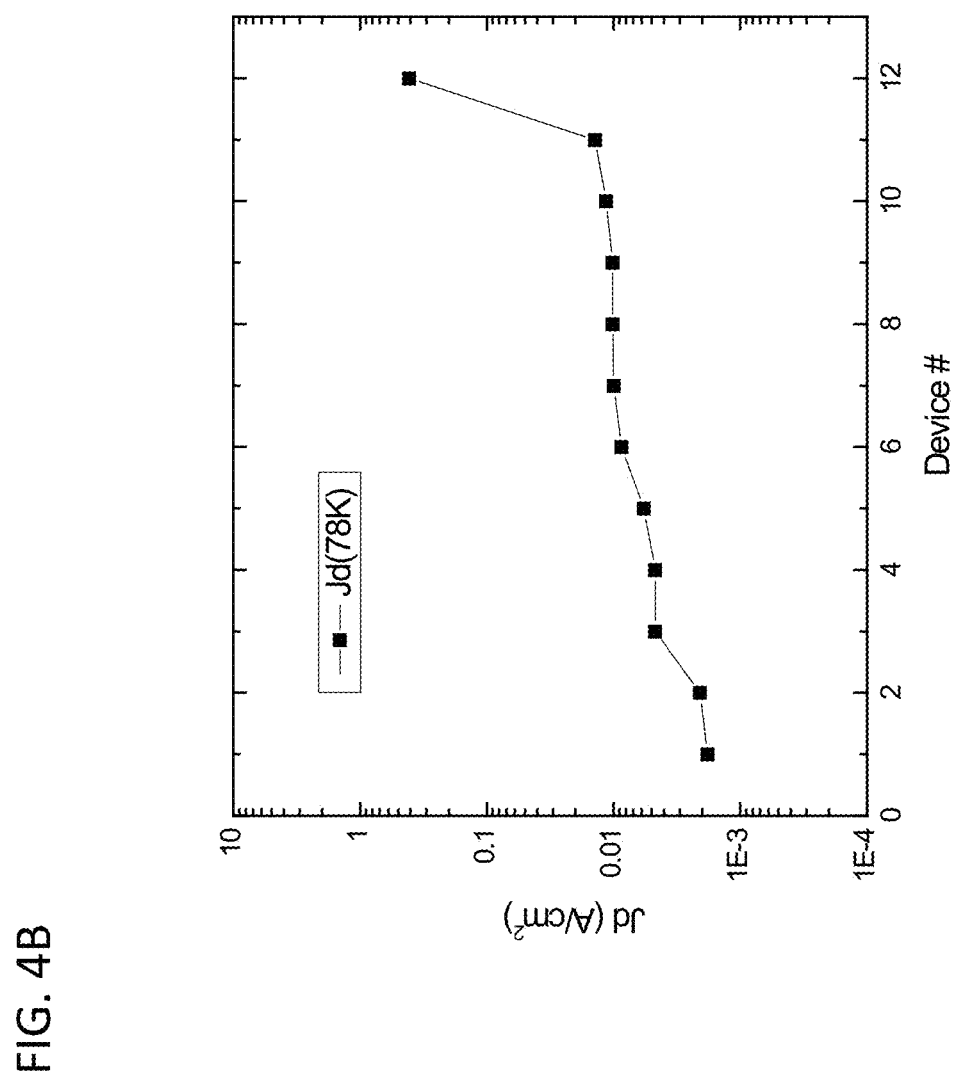
FIG. 4B provides a data graph plotting the dark current densities for long wave barrier detectors formed in accordance with embodiments.
Figure 4C:
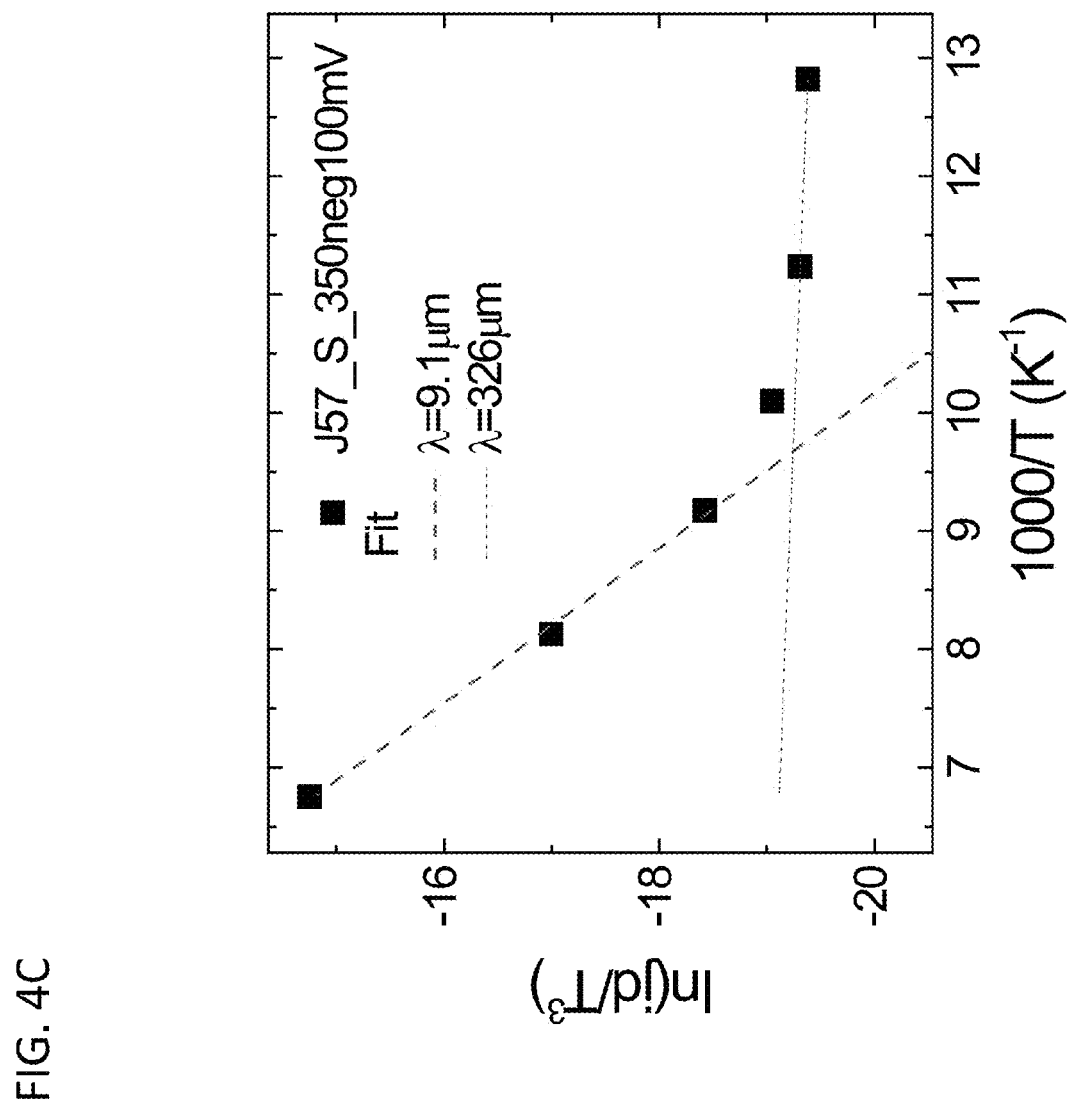
FIG. 4C provides a data graph plotting the dark current versus temperature which shows the origins of the dark current in a longwave superlattice device in accordance with embodiments.
Figure 4D:
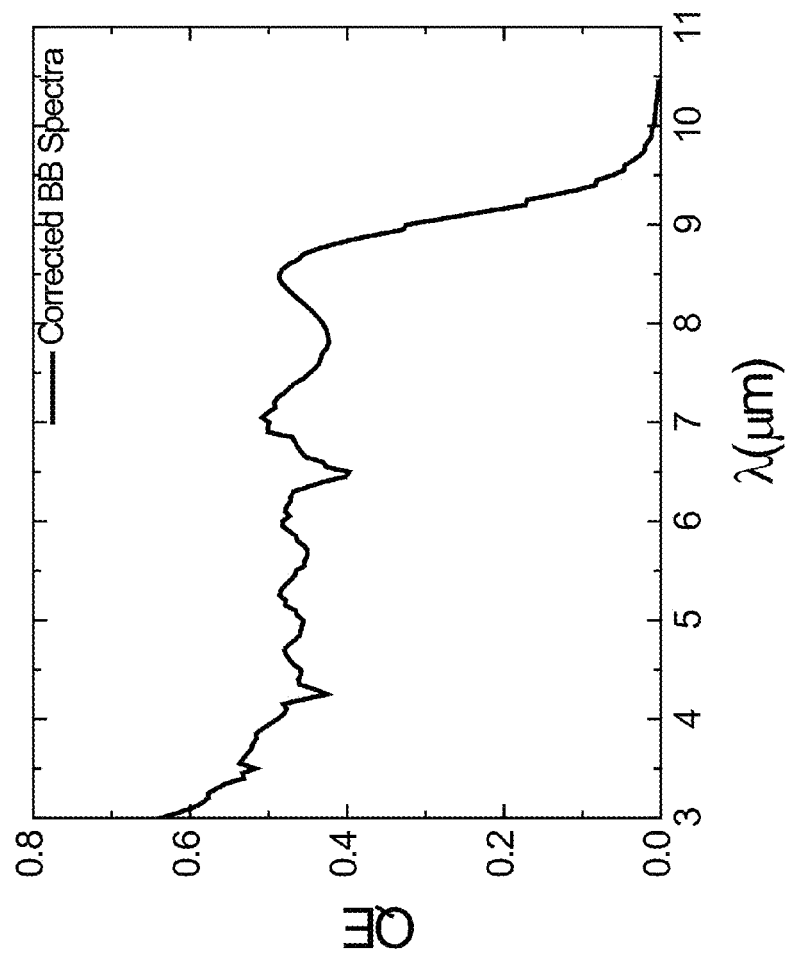
FIG. 4D provides a data graph plotting quantum efficiency versus voltage bias for a high QE longwave superlattice detector in accordance with embodiments.

FIGS. 4A to 4D provide graphs of the performance of the device at temperatures from 78K to 148K. As shown in FIG. 4A, the detector in accordance with embodiments shows dark current density across the entire range of temperatures. A series of devices were formed and showed excellent reproducibility of dark current density, as shown in FIG. 4B. As shown in FIG. 4C there are two main contributions into the dark current for exemplary absorbers (diffusion and GR). The GR component may be eliminated by implementing the absorber in a BIRD configuration, as described in U.S. Pat. No. 8,217,480 B2, cited above. FIG. 4D shows that the LW Bird detector has a QE of ~50% all the way up to the cutoff wavelength of around 9 μm (which is the first and highest QE measured in longwave InAs/InAsSb detectors). In summary, the data results from these exemplary embodiments show that p-doped SL LW detectors in accordance with embodiments demonstrate performance metrics in the longwave regime that are unexpectedly improved over conventional n-doped SL detectors.

Figure 5:
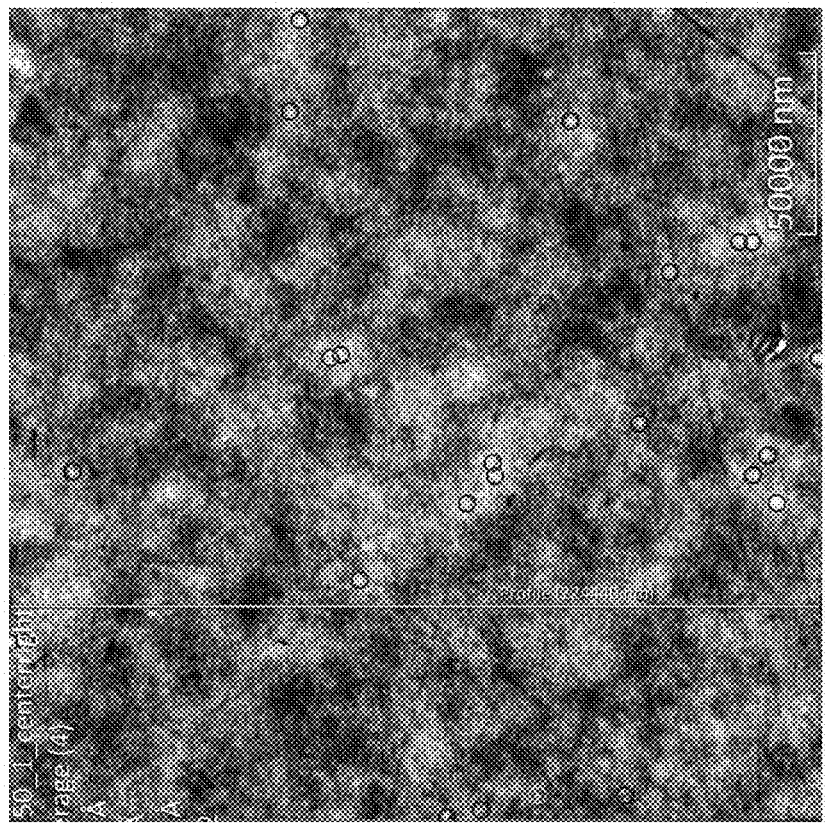
FIG. 5 provides an image of the surface of a long wave focal plane array material formed in accordance with embodiments of the invention.
Figure 6:
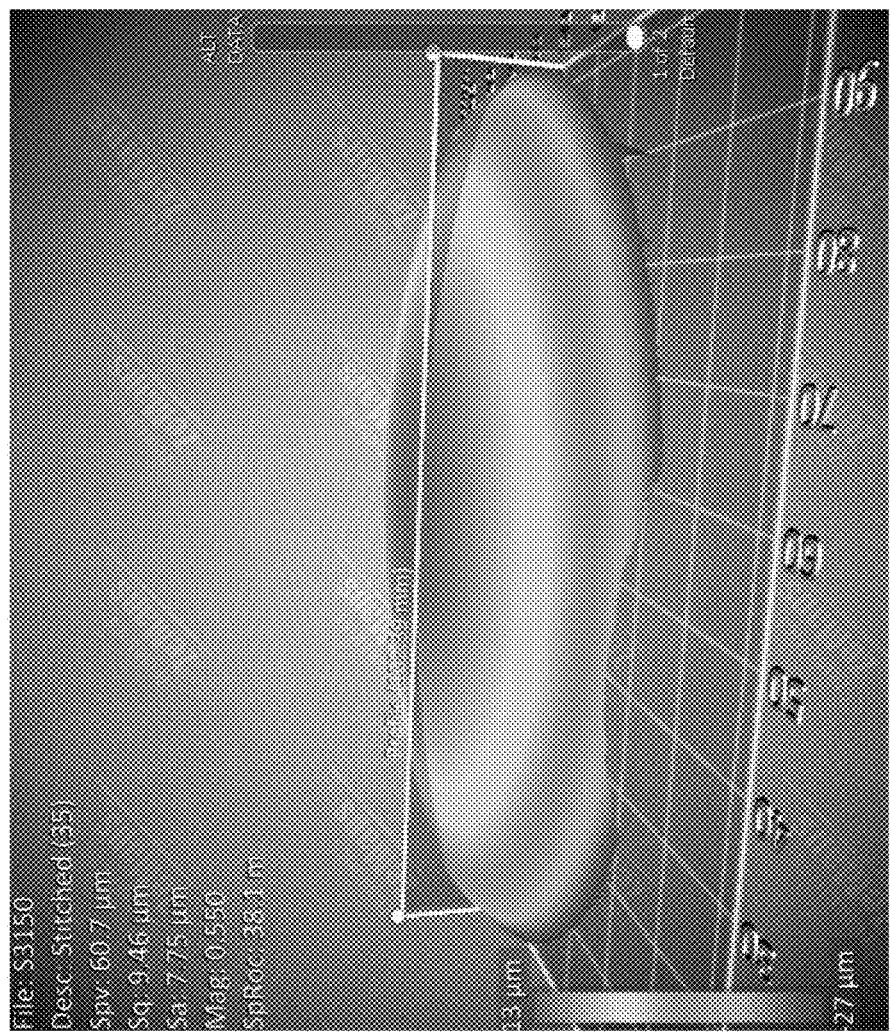
FIG. 6 provides an image of the curvature and bow of the focal plane array material of a long wave detector formed in accordance with embodiments of the invention.

Utilizing a p-doped InAs/InAsSb pin detector in accordance with embodiments, a 320×256 array will be fabricated. FIGS. 5 and 6 provide images of the LW pin detector material, which is processed in to focal plane array in accordance with the structure and methods, showing smooth surfaces and low bow across the wafer growth indicating a high quality focal plane array material is achievable. The surface characteristics of this FPA material (shown in FIGS. 5 and 6), as well as the measured structural properties attest to the high quality nature of the FPA material. The noise equivalent temperature (NEDT) of 25.6 mK for embodiments of the FPA device have a predicted operability of 99.6% at 60K, and a predicted image quality obtainable from an FPA in accordance with embodiments having an expected median QE value of more than 36.1% at 60 K.

Having described several embodiments, it will be recognized by those skilled in the art that various modifications, alternative constructions, and equivalents may be used without departing from the spirit of the invention. For example, although exemplary embodiments described the use of a p-doped absorber in accordance with embodiments in a pin structure, it should be understood that absorbers in accordance with embodiments may be utilized in a wide-variety of structures including, for example, pBp, nBn, homojunction, heterostructures, and double heterostructure infrared detectors. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An infrared photodetector absorber material comprising a p-doped Ga-free superlattice material formed of alternating layers of InAsSb and InAs, and having a cutoff wavelength of from 8 to 13 μm, wherein the superlattice material is doped with Be in a concentration of from $1\times10^{15}$ to $5\times10^{15}$ cm$^{-3}$ to compensate for residual n-type carriers.

2. The infrared photodetector absorber material according to claim 1, wherein the Be is incorporated into the superlattice material in a concentration of about $2.5\times10^{15}$ cm$^{-3}$.

3. The infrared photodetector absorber material according to claim 1, wherein Sb is in a concentration of around 59%.

4. An infrared photodetector comprising:
   a substrate formed of a substrate material;
   an infrared detector structure disposed atop the substrate and at least comprising at least one Ga-free absorber superlattice formed of alternating layers of InAsSb and InAs, and having a cutoff wavelength of from 8 to 13 μm, wherein the superlattice material is doped with Be in a concentration of from $1\times10^{15}$ to $5\times10^{15}$ cm$^{-3}$ to compensate for residual n-type carriers.

5. The infrared photodetector according to claim 4, wherein the Be is incorporated into the superlattice material in a concentration of about $2.5\times10^{15}$ cm$^{-3}$.

6. The infrared photodetector according to claim 4, wherein Sb is in a concentration of around 59%.

7. The infrared photodetector according to claim 4, further comprising one or more structures selected from the group consisting of contact layers, unipolar barrier layers, and graded transitional structures.

8. The infrared photodetector according to claim 7, further comprising at least one graded transitional structure disposed between at least two other layers of the photodetector to align at least one portion of the bandgap of the photodetector.

9. The infrared detector of claim 4, wherein the substrate is a material selected from the group consisting of Si, GaAs, Ge, InAs, GaP, and InP.

10. The infrared detector of claim 4, wherein the detector has a detector has a structure selected from the group consisting of pin, pBp, nBn, homojunction, heterostructure, and double heterostructure.

11. An infrared photodetector comprising:
a substrate formed of a substrate material;
an infrared detector structure disposed atop the substrate and at least comprising at least one Ga-free absorber superlattice formed of alternating layers of InAsSb and InAs having a cutoff wavelength of from 8 to 13 μm, wherein the superlattice material is p-type doped with Be in a concentration of from $1 \times 10^{15}$ to $5 \times 10^{15}$ cm$^{-3}$ to compensate for residual n-type carriers.

12. The infrared photodetector according to claim 11, wherein the Be is incorporated into the superlattice material in a concentration of about $2.5 \times 10^{15}$ cm$^{-3}$.

13. The infrared photodetector according to claim 11, wherein Sb is in a concentration of around 59%.

14. The infrared photodetector according to claim 11, further comprising one or more structures selected from the group consisting of contact layers, unipolar barrier layers, and graded transitional structures.

* * * * *